United States Patent
Stegen et al.

(10) Patent No.: US 11,720,032 B2
(45) Date of Patent: Aug. 8, 2023

(54) PROCESS TOOL AND AN INSPECTION METHOD

(71) Applicant: ASML NETHERLANDS B.V., Veldhoven (NL)

(72) Inventors: Raphael Nico Johan Stegen, Eindhoven (NL); Erik Henricus Egidius Catharina Eummelen, Veldhoven (NL); Christianus Wilhelmus Johannes Berendsen, Eindhoven (NL); Theodorus Wilhelmus Polet, Geldrop (NL); Giovanni Luca Gattobigio, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/273,758

(22) PCT Filed: Aug. 30, 2019

(86) PCT No.: PCT/EP2019/073183
§ 371 (c)(1),
(2) Date: Mar. 5, 2021

(87) PCT Pub. No.: WO2020/064265
PCT Pub. Date: Apr. 2, 2020

(65) Prior Publication Data
US 2021/0349397 A1    Nov. 11, 2021

(30) Foreign Application Priority Data
Sep. 24, 2018  (EP) .................... 18196191

(51) Int. Cl.
*G03F 7/20*       (2006.01)
*G03F 7/00*       (2006.01)
*G01N 21/88*      (2006.01)

(52) U.S. Cl.
CPC .......... *G03F 7/7065* (2013.01); *G01N 21/88* (2013.01); *G03F 7/70341* (2013.01);
(Continued)

(58) Field of Classification Search
CPC ............... G03F 7/7065; G03F 7/70341; G03F 7/70716; G01N 21/88
See application file for complete search history.

(56) References Cited

U.S. PATENT DOCUMENTS 5,515,167 A    5/1996  Ledger et al.
6,160,619 A *  12/2000  Magome .................. G02B 1/04
                                                       356/508

(Continued)

FOREIGN PATENT DOCUMENTS

EP       1420298       5/2004
JP      2005005291     1/2005

(Continued)

OTHER PUBLICATIONS

International Search Report and Written Opinion issued in corresponding PCT Patent Application No. PCT/EP2019/073183, dated Nov. 28, 2019.

(Continued)

*Primary Examiner* — Hung V Nguyen
(74) *Attorney, Agent, or Firm* — Pillsbury Winthrop Shaw Pittman, LLP

(57) ABSTRACT

A process tool for processing production substrates, the process tool including: a movable stage configured to perform long-stroke movements in an X-Y plane; an imaging device mounted to a fixed part of the tool and having an (Continued)

optical axis substantially parallel to the X-Y plane; and a mirror mounted on the movable stage and oriented at a predetermined angle of inclination to the X-Y plane so that by moving the movable stage to a predetermined position a part of a component to be inspected can be imaged by the imaging device.

20 Claims, 5 Drawing Sheets

(52) U.S. Cl.
CPC . *G03F 7/70716* (2013.01); *G01N 2201/0636* (2013.01); *G01N 2201/103* (2013.01)

(56) References Cited

U.S. PATENT DOCUMENTS

| | | | |
|---|---|---|---|
| 6,285,444 B1* | 9/2001 | Osanai | G03F 7/70716 355/72 |
| 7,388,649 B2 | 6/2008 | Kobayashi et al. | |
| 8,134,681 B2 | 3/2012 | Okita | |
| 9,086,635 B2* | 7/2015 | Omura | H01L 21/027 |
| 2003/0011763 A1 | 1/2003 | Taniguchi et al. | |
| 2004/0207824 A1 | 10/2004 | Lof et al. | |
| 2006/0077367 A1 | 4/2006 | Kobayashi et al. | |
| 2006/0176457 A1 | 8/2006 | Ishii et al. | |
| 2006/0274297 A1 | 12/2006 | Ogusu | |
| 2007/0058146 A1* | 3/2007 | Yamaguchi | G03F 7/70775 355/53 |
| 2007/0127135 A1 | 6/2007 | Nagasaka | |
| 2007/0219736 A1 | 9/2007 | Okita | |
| 2007/0258072 A1 | 11/2007 | Nagasaka et al. | |
| 2008/0013064 A1 | 1/2008 | Nishii | |
| 2008/0084546 A1 | 4/2008 | Owa et al. | |
| 2008/0137045 A1 | 6/2008 | Kiuchi | |
| 2008/0156356 A1 | 7/2008 | Nagasaka et al. | |
| 2008/0212043 A1 | 9/2008 | Nagasaka | |
| 2008/0239314 A1 | 10/2008 | Bonciolini et al. | |
| 2008/0309892 A1 | 12/2008 | Chen et al. | |
| 2009/0002658 A1 | 1/2009 | Kiuchi | |
| 2009/0059217 A1 | 3/2009 | Okita | |
| 2009/0061331 A1 | 3/2009 | Nakano | |
| 2009/0103064 A1 | 4/2009 | Yoda | |
| 2009/0109413 A1 | 4/2009 | Shibazaki et al. | |
| 2009/0135382 A1 | 5/2009 | Kida | |
| 2009/0251672 A1 | 10/2009 | Nagasaka et al. | |
| 2010/0245790 A1 | 9/2010 | Seltmann et al. | |
| 2010/0296068 A1 | 11/2010 | Shibazaki | |
| 2011/0222037 A1 | 9/2011 | Kiuchi et al. | |
| 2012/0204913 A1 | 8/2012 | Nagasaka et al. | |
| 2012/0307045 A1 | 12/2012 | Hisano et al. | |
| 2015/0241789 A1 | 8/2015 | Wu et al. | |
| 2018/0181004 A1 | 6/2018 | Saeed et al. | |
| 2018/0275535 A1* | 9/2018 | Fujishima | G03F 9/7084 |

FOREIGN PATENT DOCUMENTS

| | | |
|---|---|---|
| JP | 2007005494 | 1/2007 |
| JP | 2007288039 | 11/2007 |
| JP | 2010505118 | 2/2010 |
| JP | 2011014929 | 1/2011 |
| JP | 2012247368 | 12/2012 |
| TW | 201706879 | 2/2017 |
| WO | 99/49504 | 9/1999 |
| WO | 2006013806 | 2/2006 |
| WO | 2017084797 | 5/2017 |
| WO | 2018007118 | 1/2018 |
| WO | 2018007119 | 1/2018 |

OTHER PUBLICATIONS

Taiwanese Office Action issued in corresponding Taiwanese Patent Application No. 108132864, dated Nov. 10, 2020.
Taiwanese Office Action issued in corresponding Taiwanese Patent Application No. 108132864, dated Aug. 6, 2020.
Japanese Office Action issued in corresponding Japanese patent Application No. 2021-512870, dated Jan. 27, 2022.

\* cited by examiner

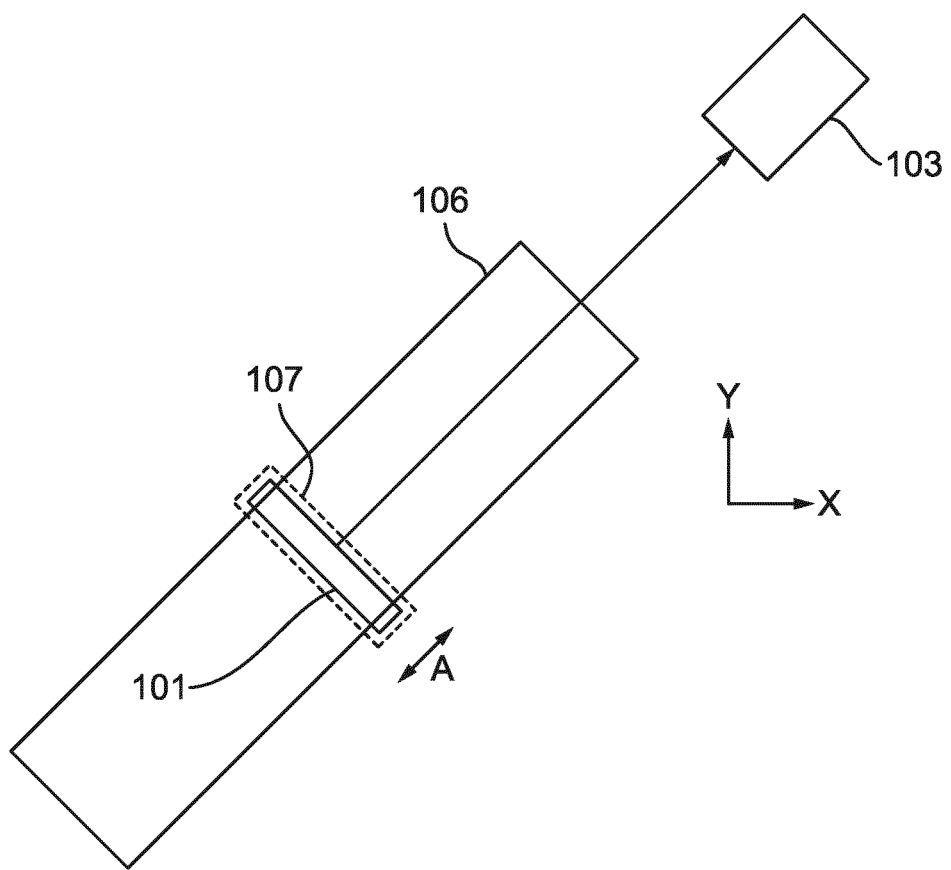

PROCESS TOOL AND AN INSPECTION METHOD

CROSS-REFERENCE TO RELATED APPLICATIONS

This application is the U.S. national phase entry of PCT Patent Application No. PCT/EP2019/073183, which was filed Aug. 30, 2019, which claims the benefit of priority of European Patent Application No. 18196191.3, which was filed on Sep. 24, 2018 and which is incorporated herein in its entirety by reference.

FIELD

The present invention relates to a process tool—such as a lithographic apparatus, a metrology apparatus or a process apparatus—and an inspection method for use in a process tool, for example.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa.) A fluid handling structure present between the projection system and the stage is used to confine the immersion to the immersion space. The space filled by liquid is smaller in plan than the top surface of the substrate and the space remains substantially stationary relative to the projection system while the substrate and substrate stage move underneath.

The fluid handling structure is a structure which supplies liquid to the immersion space, removes the liquid from the space and thereby confines liquid to the immersion space. It includes features which are a part of a fluid supply system. The arrangement disclosed in PCT patent application publication no. WO 99/49504 is an early fluid handling structure comprising pipes which either supply or recover liquid from the space and which operate depending on the relative motion of the stage beneath the projection system. In more recent designs of fluid handling structure extends along at least a part of a boundary of the space between the final element of the projection system and the substrate table 60 or substrate W, so as to in part define the space.

A lithographic apparatus is a complex apparatus and most of its critical parts have to be operated under very controlled environments, with higher contamination specifications than standard for cleanrooms. If the apparatus has to be opened up for maintenance or inspection, time consuming processes such as decontamination and start-up may need to be taken before the apparatus can be returned to service. It is desirable that any downtime of the apparatus be minimized as far as possible since this reduces the productivity of the apparatus and increases cost of ownership.

It has been proposed to put inspection sensors, such as cameras, in a dummy substrate (see for example US2007219736, WO18007119 and WO18007118) that can handled by a lithographic apparatus as if it were a production substrate. It has also been proposed to put an inspection sensor in a table, e.g. a substrate table, a measurement table or a calibration table (see WO 2006/013806 and US2009103064). Both of these approaches have drawbacks.

An inspection substrate is of limited thickness, making it difficult to provide a camera having a large field of view and/or imaging distance. Adding a camera to a movable table such as a substrate table increases the mass and complexity of a critical part of the apparatus. Furthermore, getting the images from the camera to the outside world would likely require additional cabling to the substrate table which is undesirable.

SUMMARY

It is desirable, for example, to provide improved means to enable critical parts of the apparatus to be inspected with minimum downtime.

According to an aspect, there is provided a process tool for processing production substrates, the process tool comprising:

a movable stage configured to perform long-stroke movements in an X-Y plane;

a component to be inspected;

an imaging device mounted to a fixed part of the tool and having an optical axis substantially parallel to the X-Y plane; and a mirror mounted on the movable stage and oriented at a predetermined angle of inclination to the X-Y plane so that by moving the movable stage to a predetermined position a part of the component can be imaged by the imaging device.

According to an aspect, there is provided a method of inspecting a component of a process tool for processing production substrates, the method comprising:

positioning a movable stage having a mirror mounted thereon at a predetermined position relative to a component of the process tool that is liable to contamination; and using an imaging device mounted on a fixed part of the process tool to image the component via the mirror.

According to an aspect, there is provided an inspection substrate comprising a main body having dimensions compatible with a substrate processing apparatus and a mirror mounted on a major surface of the main body, wherein the mirror is oriented at a predetermined angle of inclination to the major surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 is a schematic plan view illustrating an inspection system of another embodiment of the invention.

DETAILED DESCRIPTION

Figure 1:
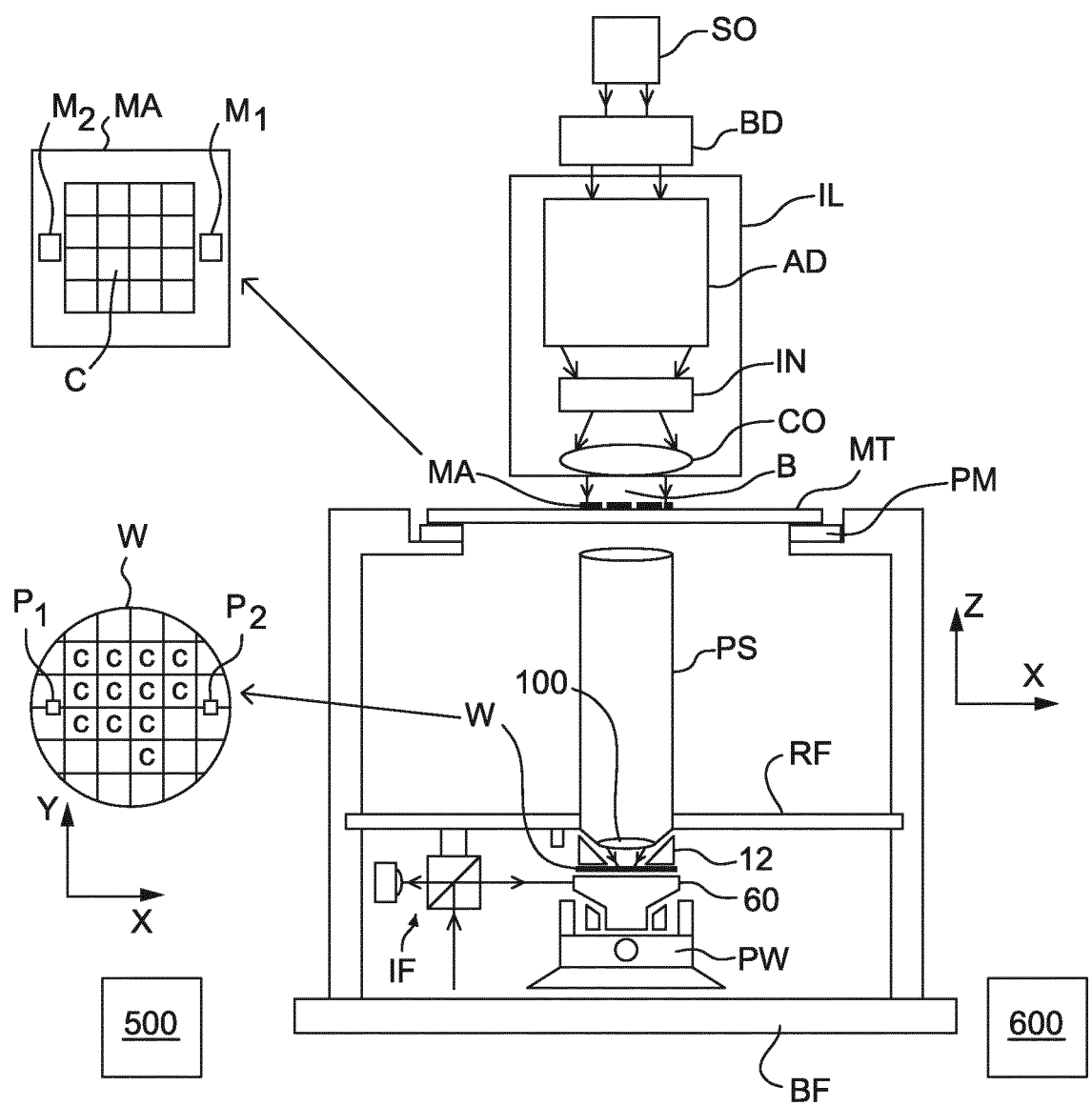
FIG. 1 schematically depicts a lithographic apparatus.

FIG. 1 schematically depicts a lithographic apparatus in which an embodiment of the invention can be used. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) 60 or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as G-outer and G-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table 60 can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table 60 or "substrate support" may be realized using a long-stroke module and a short-stroke module, which form part of the second positioner PW. In an embodiment, the substrate table may perform long-stroke movements in the X-Y plane only (e.g. in X, Y and Rz directions) and only short-stroke movements in other degrees of freedom. A long-stroke module can have a range of movements comparable to or greater than the diameter of the substrate. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing liquid between a final lens element of the projection system PS and the substrate can be classed into three general categories. These are the bath type arrangement, the so-called localized immersion systems and the all-wet immersion systems. The present invention relates particularly to the localized immersion systems.

Figure 2:
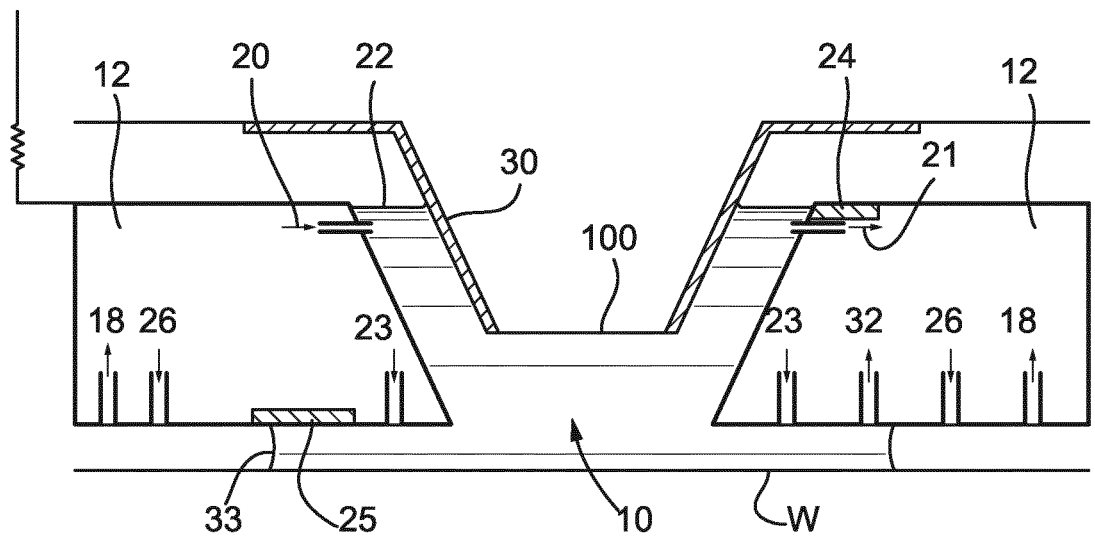
FIG. 2 schematically depicts a immersion liquid confinement structure for use in a lithographic projection apparatus.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table 60 which surrounds the substrate or both. Such an arrangement is illustrated in FIG. 2. The arrangement illustrated in FIG. 2 and described below may be applied to the lithographic apparatus described above and illustrated in FIG. 1.

FIG. 2 schematically depicts the liquid confinement structure 12. The liquid confinement structure 12 extends along at least a part of a boundary of the immersion space 10 between the final lens element 100 of the projection system PS and the substrate table 60 or substrate W. In an embodiment, a seal is formed between the liquid confinement structure 12 and the surface of the substrate W/substrate table 60. The seal may be a contactless seal such as a gas seal (such a system with a gas seal is disclosed in European patent application publication no. EP-A-1,420,298) or a liquid seal.

The liquid confinement structure 12 is configured to supply and confine immersion liquid to the immersion space 10. Liquid is brought into the immersion space 10 by liquid inlet 13. The liquid may be removed by liquid outlet 13.

The liquid may be contained in the immersion space 10 by a gas seal 16 which, during use, is formed between the bottom of the liquid confinement structure 12 and the facing surface of the table (i.e. the surface of the substrate W and/or the surface of the substrate table 60). The gas in the gas seal 16 is provided under pressure via inlet 15 to a gap between the liquid confinement structure 12 and substrate W and/or substrate table 60. The gas is extracted via a channel associated with outlet 14. The overpressure on the gas inlet 15, vacuum level on the outlet 14 and geometry of the gap are arranged so that there is a high-velocity gas flow inwardly that confines the liquid. The force of the gas on the liquid between the liquid confinement structure 12 and the substrate W and/or substrate table 60 contains the liquid in the immersion space 10. Such a system is disclosed in United States patent application publication no. US 2004-0207824. Other liquid confinement systems 12 can be used with the present invention.

Figure 3:
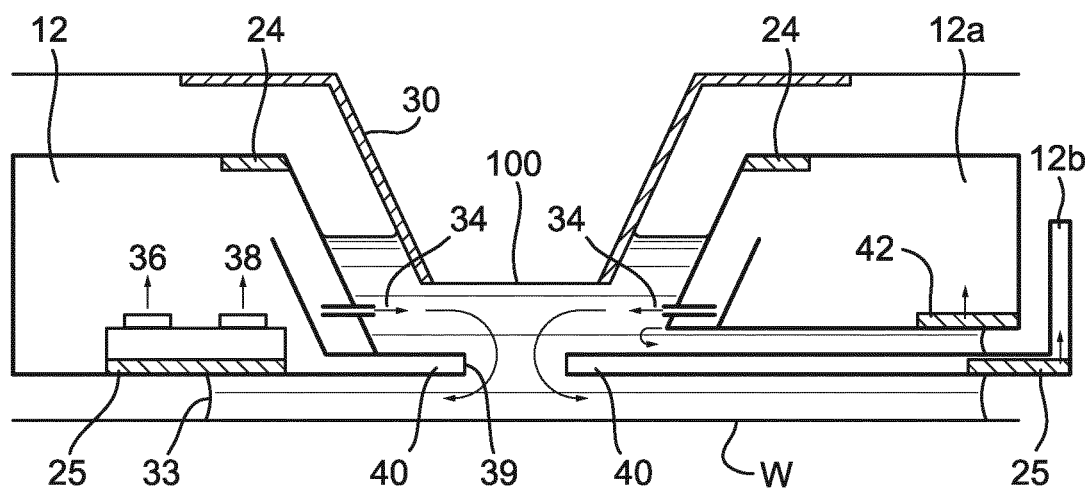
FIG. 3 is a side cross sectional view that schematically depicts a further immersion liquid supply system according to an embodiment.
Figure 4:
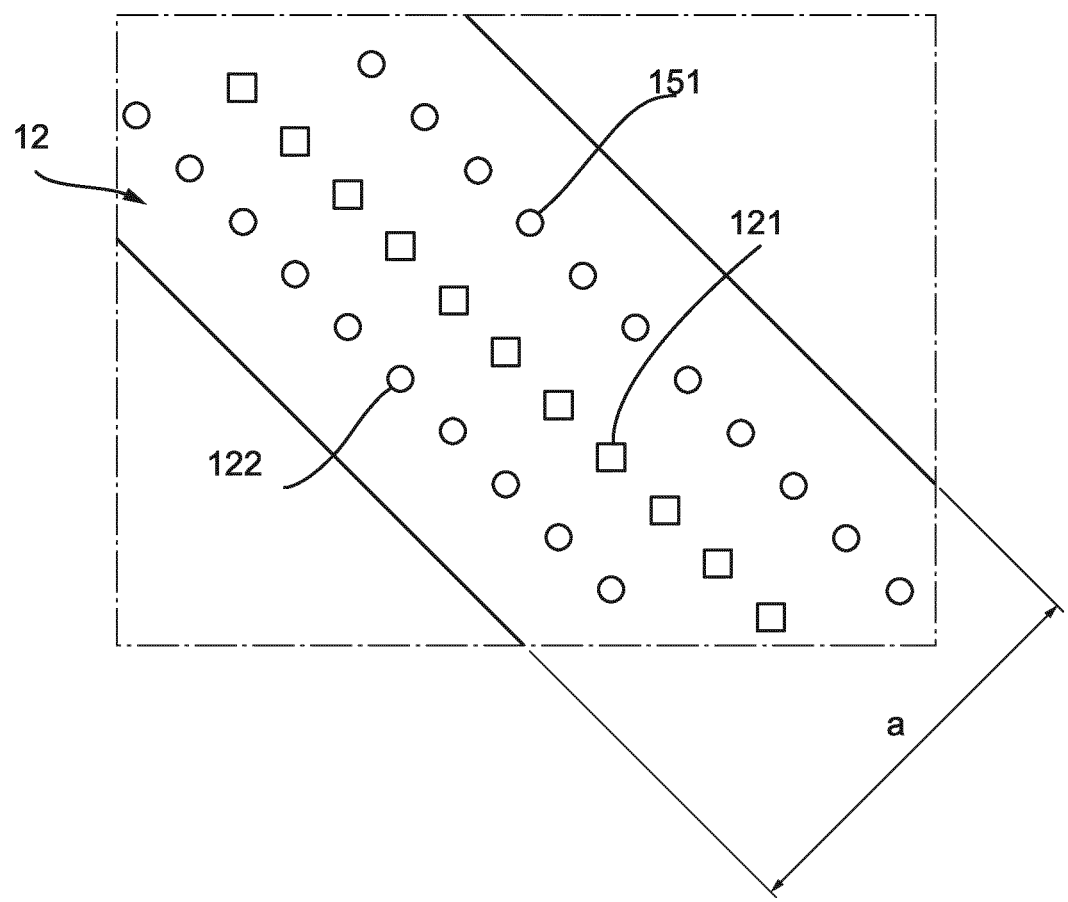
FIG. 4 depicts the underside of a part of an immersion liquid confinement structure for use in a lithographic projection apparatus.

FIGS. 2 and 3 show different features which may be present in variations of confinement structure 12. The designs may share some of the same features as FIG. 2 unless described differently. The features described herein may be selected individually or in combination as shown or as required.

FIG. 2 shows a confinement structure 12 around the bottom surface of a last lens element. The last lens element 100 has an inverted frustro-conical shape. The frustro-conical shape having a planar bottom surface and a conical surface. The frustro-conical shape protrudes from a planar surface and having a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar. The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The confinement structure extends closer to the facing surface of the wafer and wafer table than the last lens element. A space is therefore defined between the inner surface of the confinement structure, the planar surface of the frustro-conical portion and the facing surface. During use, the space is filled with liquid. The liquid fills at least part of a buffer space between the complementary surfaces between lens and the confinement structure, in an embodiment at least part of the space between the complementary inner-surface and the conical surface.

Liquid is supplied to the space through an opening formed in the surface of the liquid confinement structure. The liquid may be supplied through a supply opening 20 in the inner-surface of the liquid confinement structure. Alternatively or additionally, the liquid is supplied from an under supply opening 23 formed in the undersurface of the confinement structure 12. The under supply opening may surround the path of the projection beam and it may be formed of a series of openings in an array. The liquid is supplied to fill the space 10 so that flow through the space under the projection system is laminar. The supply of liquid from the opening 23 under the liquid confinement structure additionally prevents the ingress of bubbles into the space. This supply of liquid functions as a liquid seal.

The liquid may be recovered from a recovery opening 21 formed in the inner-surface. The recovery of the liquid through the recovery opening may be by application of an under pressure; the recovery through the opening 21 as a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12.

Additionally or alternatively, liquid may be recovered from under the liquid confinement structure through a bottom recovery opening 25, 32. The bottom recovery opening may serve to hold (or 'pin') a liquid meniscus to the liquid confinement structure. The meniscus forms between the liquid confinement structure and the facing surface and it serves as border between the liquid space and the gaseous external environment. The bottom recovery opening 25 may be a porous plate 25 which may recover the liquid in a single phase flow. The bottom recovery opening may be a series of pining openings 32 through which the liquid is recovered. The pining openings may recover the liquid in a two phase flow.

Optionally radially outward, with respect to the inner-surface of the liquid confinement structure, is a gas knife opening 26. Gas may be supplied through the gas knife opening at elevated speed to assist confinement of the immersion liquid in the space. The supplied gas may be humidified and it may contain carbon dioxide. The supplied gas may consist essentially of carbon dioxide and water vapor. Radially outward of the gas knife opening is a gas recovery opening 28 for recovering the gas supplied through the gas knife.

Features shown in FIG. 3 which are common to FIG. 2 share the same reference numbers. The confinement structure 12 has an inner surface which complements the conical surface of the frustro-conical shape. The undersurface of the confinement structure is closer to the facing surface than the bottom planar surface of the frustro-conical shape.

Liquid is supplied to the space through supply openings formed in the inner surface of the confinement structure. The supply openings 34 are located towards the bottom of the inner surface, perhaps below the bottom surface of the frustro-conical shape. The supply openings are located inner surface, space apart around the path of the projection beam.

Liquid is recovered from the space 10 through recovery openings 25 in the undersurface of the liquid confinement structure 12. As the facing surface moves under the confinement structure, the meniscus may migrate over the surface of the recovery opening 25 in the same direction as the movement of the facing surface. The recovery openings may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of confinement structure extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the confinement structure may be in two parts: an inner part 12a and an outer part 12b. For convenience this arrangement is shown in the right-hand part of FIG. 3. The two parts may move relatively to each other, in a plane parallel to facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

Contamination of various types can adversely affect the performance of a fluid handling system in a lithographic apparatus. Although the environment of the lithographic apparatus is kept to a very low contaminant level and the immersion liquid, e.g. water, is very pure, the possibility of particulate contamination of the fluid handling system cannot be wholly eradicated. The presence of even small contaminants at critical locations within the fluid handling system can reduce its effectiveness.

For example, the presence of a fiber on, for example adhered to, the lower surface of a liquid confinement structure 12 may increase defectivity and may contribute to a reduction in productivity. The presence of a fiber adjacent, or even over, a water extraction orifice can lead to additional water loss onto a production substrate during exposures. Also, a partial or complete blockage of a gas outlet forming part of a gas seal for confining the immersion liquid can lead to water loss onto a production substrate. Water loss on a production substrate can cause defects in exposed patterns. The defects may be formed through the creation of watermarks on the resist as a consequence of evaporating droplets. In a different mechanism, a bubble may be generated on collision between the meniscus of the confined immersion liquid and a droplet remaining on the substrate. The bubble may travel in the immersion space to interfere with the path of the projection beam.

It is often difficult to detect that contamination has reduced the effectiveness of the liquid confinement system. Often the first sign of contamination of a confinement structure 12 will be a decrease in yield due to an increase in the number of defects in exposed patterns; an increase in defect count may not become immediately apparent. Opening the lithographic apparatus to inspect the liquid confinement structure for contaminants is time consuming. The procedure of inspection presents a risk of contamination, so it is undesirable to perform such an inspection unless absolutely necessary.

The present invention proposes an inspection system that can be provided in a process tool, such as a lithographic apparatus, to allow a component of the process tool, such as a liquid confinement structure, to be inspected without opening the process tool, thereby reducing downtime and minimizing the risk of further contamination.

Figure 5:
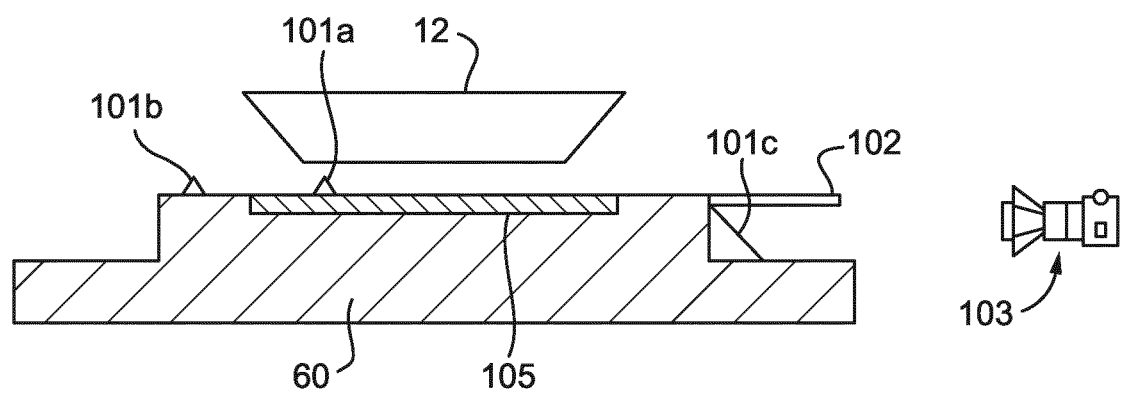
FIG. 5 depicts an inspection system in a lithographic apparatus according to an embodiment of the invention.

FIG. 5 depicts a parts of a lithographic apparatus as an example of a process tool embodying the invention. The lithographic apparatus comprises a movable stage 60 configured to perform long-stroke movements in an X-Y plane, in an embodiment this is the substrate stage that is used to hold and position substrates for exposure. As well as long-stroke movements, which are of a range equal to or greater than the diameter of a substrate (e.g. 300 mm), the substrate stage 60 may be capable of short-stroke movements, e.g. with a range of movement less than 10 mm, in other degrees of freedom as well as rotational movements.

An example of a component that is to be inspected is the liquid confinement structure 12. As discussed above it has various openings in its lower surface, facing the movable stage 60, that can become blocked or partially blocked by contaminants. The component to be inspected can be any other component that is liable to become contaminated during the operation of the apparatus, for example grid plates of an encoder-based position sensing system.

Figure 6:
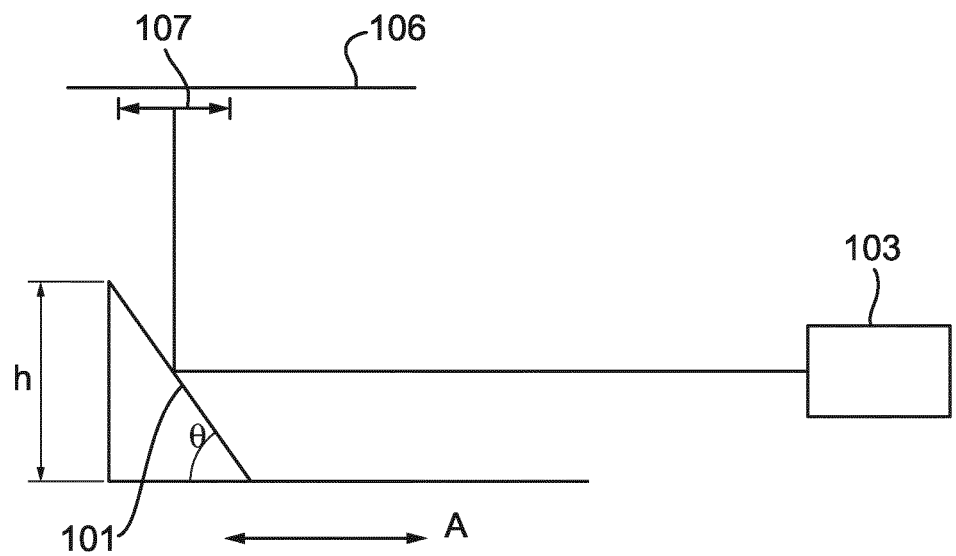
FIG. 6 is a diagram illustrating a principle of operation of an inspection system in an embodiment of the invention.

The inspection system includes an imaging device 103 mounted to a fixed part of the lithographic apparatus and having an optical axis substantially parallel to the X-Y plane, in which the long-stroke movements of the movable stage are made. The imaging device is not mounted to the movable stage and so it is not necessary to provide power and data connections for the imaging device to the movable stage, nor is the mass of the movable stage significantly increased. A mirror 101 is mounted on the movable stage and oriented at a predetermined angle of inclination to the X-Y plane so that, when the movable stage is at a predetermined position, a part of the component can be imaged by the imaging device via the mirror 101, as depicted in FIG. 6. In an embodiment, the predetermined angle of inclination $\theta$ is in the range of from 30° to 60°, desirably substantially 45°. The imaging device and mirror are arranged so that by moving the substrate stage 60 in the direction indicated by arrow A to appropriate positions, different parts of the component to be inspected can be viewed by the imaging device via the mirror.

The imaging device can be an off-the-shelf camera operating in the visual wavelengths, infra-red and/or ultraviolet. A monochrome camera or a color camera can be used. Polarizing filters can be used to enhance the contrast between polished surfaces of the component to be inspected and contamination. A video camera can be used to take images as a component to be inspected is scanned though the field of view of the video camera. A binocular camera can be used. Illuminating devices, e.g. LEDs, can be provided adjacent the imaging device, adjacent to the mirror(s) or elsewhere in the process tool, as convenient.

Detection of contamination using the images captured by the imaging device can be done by a variety of methods, such as visual inspection by a technician, comparison to reference images of a clean component and automated image recognition, e.g. using machine learning. Automated analysis of images captured by the imaging device can be performed by the control system 500 or by another computing device 600. The automated analysis device can be performed by a computing device in the process tool or external thereto.

In most instances, the imaging device can be situated within at most a few meters of the component to be inspected so that an excessively long focal length imaging lens is not required, even to enable contaminants as small as 20 µm to be detected.

The imaging device can be provided with a controllable focus and/or a controllable zoom and a control circuit configured to control the focus and/or zoom of the imaging device in synchronism with movements of the movable stage.

In FIG. 5, three mirrors are depicted as examples of possible locations of the mirror 101; an embodiment of the invention might have only one mirror or might have multiple mirrors in some or all of the depicted locations.

Mirror 101a is mounted on the upper surface of an inspection substrate 105 which can be held on the movable stage. The inspection substrate is compatible with the lithographic apparatus, e.g. by having a diameter and thickness substantially equal to those of a production substrate. The inspection substrate can therefore be loaded into the lithographic apparatus using the same mechanisms as a production substrate without needing to open the lithographic apparatus to the cleanroom environment. By using a mirror mounted on an inspection substrate, the mirror can be loaded into the process tool only when required.

Mirror 101b is provided on an upper surface of the movable stage 60. Mirror 101b can be provided as part of a fiducial or sensor module mounted on the movable stage. A mirror provided on the upper surface of the substrate can be positioned close to the component to be inspected reducing the optical path length between the imaging device and the component.

Mirror 101c is provided on a side surface of the movable stage 60. A mirror on the side surface of the movable stage can be made larger than a mirror on the upper surface of the movable stage as it is not restricted by the distance between the movable stage and liquid confinement structure 12, thus a larger field of view of the imaging device can be achieved. A lithographic apparatus having an interferometer-based displacement measuring system might have a mirror at 45° to the X-Y plane mounted on or formed on the side of the movable stage to enable measurement of displacements in the Z direction. Such a mirror can also be used as the mirror of the present invention.

Optionally, a transparent member 102 can be mounted to the movable stage above the mirror, the transparent member having an upper surface substantially flush with an upper surface of the movable stage 60. The transparent member allows the liquid confinement system to be inspected whilst operating, i.e. with immersion liquid in the immersion space.

Figure 7:
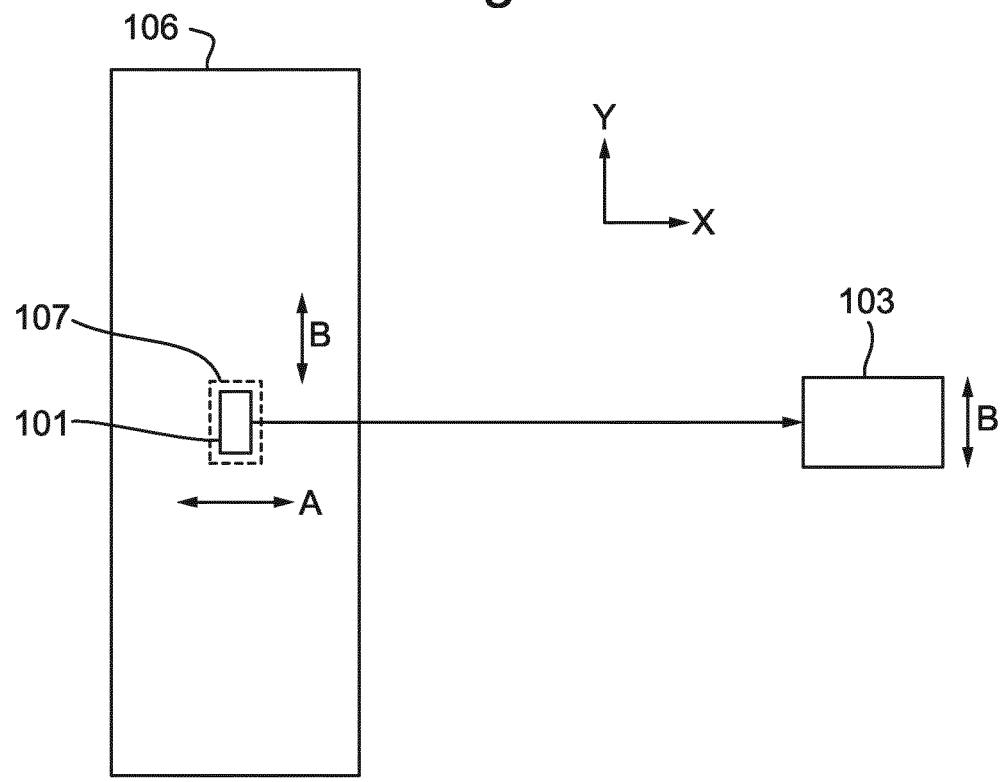
FIG. 7 is a schematic plan view illustrating a process of scanning a component to be inspected.

Desirably, the mirror is elongate in the X-Y plane to provide a larger field of view 107, as shown in FIG. 7. In order to inspect components that are larger than the field of view 107 of the imaging device 103, the movable stage (substrate stage) 60 that carries the mirror 101 can be translated in the direction indicated by arrow A, that is parallel to the optical axis of the imaging device 103.

To further increase the area of the component that can be inspected, in an embodiment of the invention, the imaging device is mounted in the process tool by an actuated stage configured to translate the imaging device parallel to at least one of the X and Y directions and/or rotate the imaging device about at least one axis (e.g. parallel to the Z axis). Such an arrangement is shown in FIG. 7 in which the camera is mounted to an actuated stage that can move in the direction indicated by arrow B whilst the movable stage 60 also moves in the same direction. Thereby a larger area of the component 106 than the field of view 107 can be imaged.

An arrangement to conveniently image a component 106 that is elongate (or an elongate part of a component), for example one side of a diamond-shaped liquid confinement-system, is depicted in FIG. 8. In this arrangement, the long dimension of the field of view 107 is made equal to or larger than the short dimension (width) of the component 106, or that part of the component 106 that is to be inspected. The mirror 101 is oriented perpendicular to the long dimension (length) of the component 106 and the optical axis of the imaging device 103 is parallel to the long dimension of the component 106. With such an arrangement all of the (part of) the component can be imaged by moving the movable stage 60 in the direction of the long dimension of the component 60 and the imaging device can be fixed.

Another approach to increasing the area or number of components that can be inspected is to provide a plurality of imaging devices and/or a plurality of mirrors. How to best arrange the mirrors and imaging devices to efficiently image the component(s) to be imaged depends on the arrangement of those components. For example, if a liquid confinement structure, as an example of a component to be inspected, has two pairs of parallel sides then each pair of sides can be simultaneously inspected by two appropriately spaced camera-mirror systems.

Another approach to increasing the area or number of components that can be inspected is to mount the imaging device on a panning mount so that different places can be inspected by panning the imaging device and translating the mirror. This can result in the image captured by the imaging device becoming distorted as the mirror is no longer perpendicular (in the X-Y plane) to the optical axis of the imaging device. However such distortion can be reduced or eliminated by image processing and/or by rotating the movable stage where possible. Also, if contamination of the component is detected by comparing current images to reference images, distortion of the images may not hinder detection of contamination.

Distortion of the images captured using an imaging device mounted on a panning mount can also be reduced by using a plurality of mirrors at different orientations in the X-Y plane. The plurality of mirrors may be mounted directly on the movable stage or on an inspection substrate held on the movable stage.

In an embodiment of the invention, the mirror is substantially flat and simply acts to fold the optical axis of the imaging device. It is also possible to use a mirror with a non-flat optical surface, e.g. having an optical power. The mirror may have a positive optical power so as to magnify the image of the component to be inspected or a negative optical power so as to increase the field of view. The mirror may be anamorphic, i.e. having different optical powers in different directions.

In a lithographic apparatus having multiple stages, it is possible to mount mirrors on all stages, some stages or just one stage. In a lithographic apparatus that has two equivalent substrate stages, mirrors can be mounted on either stage. In a lithographic apparatus that has one or more substrate stages that are used for exposure and a separate measurement or calibration stage that is used for measurement or calibration it might be advantageous to position the mirror(s) on the measurement or calibration stage so as to minimize any possible effect on exposures.

In a lithographic apparatus having a closing member for a liquid confinement system (a member such as a disk that is used to help contain the immersion liquid when no substrate or substrate table is present) the mirror(s) may be provided on the closing member or on a stage or other actuation system used to position the closing member.

Although the present invention has been described above in relation to use of the inspection substrate to inspect a component (e.g. a functional subsystem) of a lithographic apparatus, the inspection substrate can also be used to inspect a component of another apparatus, such as a metrology apparatus. The present invention can be employed in any process tool, that is any apparatus used in the manufacture of semiconductor devices on substrates. In an embodiment of the present invention that is used in a process device of the track it is desirable that the components of the inspection system are protected from conditions prevailing therein, e.g. high temperatures and application of materials such as coatings.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 405, 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive reflective, magnetic, electromagnetic and electrostatic optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

Embodiments are provided according to the following clauses:

1. A process tool for processing production substrates, the process tool comprising:
   a movable stage configured to perform long-stroke movements in an X-Y plane;
   a component to be inspected;
   an imaging device mounted to a fixed part of the tool and having an optical axis substantially parallel to the X-Y plane; and
   a mirror mounted on the movable stage and oriented at a predetermined angle of inclination to the X-Y plane so that by moving the movable stage to a predetermined position a part of the component can be imaged by the imaging device.

2. A process tool according to clause 1 wherein the movable stage is configured to support a production substrate and the mirror is provided on an upper surface of an inspection substrate held on the movable stage.

3. A process tool according to clause 1 wherein the mirror is provided on an upper surface of the movable stage.

4. A process tool according to clause 1 wherein the mirror is provided on a side surface of the movable stage.

5. A process tool according to clause 1, 2, 3 or 4, wherein the mirror is elongate in the X-Y plane.

6. A process tool according to clause 1, 2, 3 or 4, wherein the predetermined angle of inclination is substantially 45°.

7. A process tool according to clause 1, 2, 3 or 4, wherein the imaging device has a controllable focus and/or a controllable zoom and further comprising a control circuit configured to control the focus and/or zoom of the imaging device in synchronism with movements of the movable stage.

8. A process tool according to clause 1, 2, 3 or 4, wherein the imaging device is mounted to the fixed part by an actuated stage configured to translate the imaging device parallel to at least one of the X and Y directions and/or rotate the imaging device about at least one axis.

9. A process tool according to clause 1, 2, 3 or 4, further comprising an illumination device configured to illuminate the component via the mirror when the movable stage is in the predetermined position.

10. A process tool according to clause 1, 2, 3 or 4, wherein the movable stage is configured to support a substrate and further comprising a projection system for projecting an image onto a substrate supported by the movable stage.

11. A process tool according to clause 10 wherein the component is a fluid handling system, in particular a liquid confinement structure, configured to confine liquid to a space between the projection system and the substrate.

12. A method of inspecting a component of a process tool for processing production substrates, the method comprising:
   positioning a movable stage having a mirror mounted thereon at a predetermined position relative to the component of the process tool; and
   using an imaging device mounted on a fixed part of the process tool to image the component via the mirror.

13. A method according to clause 12 wherein the apparatus is a lithographic apparatus.

14. A method according to clause 13 wherein the component is a fluid handling system, in particular a liquid confinement structure.

15. An inspection substrate comprising a main body having dimensions compatible with a substrate processing apparatus and a mirror mounted on a major surface of the main body, wherein the mirror is oriented at a predetermined angle of inclination to the major surface.

The descriptions above are intended to be illustrative, not limiting. Thus, it will be apparent to one skilled in the art that modifications may be made to the invention as described without departing from the scope of the claims set out below.

The invention claimed is:

1. A process tool for processing production substrates, the process tool comprising:
   a movable stage configured to perform movements in an X-Y plane;
   an imaging sensor system mounted to a fixed part of the tool and having an optical axis substantially parallel to the X-Y plane; and
   a mirror mounted on the movable stage and oriented at a predetermined angle of inclination to the X-Y plane so that by moving the movable stage to a predetermined position the imaging sensor system is arranged to capture an image of at least part of a component to be inspected, the component being other than a substrate, or a part thereof, handled by the process tool.

2. The process tool according to claim 1, wherein the movable stage is configured to support a production substrate and the mirror is on an upper surface of an inspection substrate held on the movable stage.

3. The process tool according to claim 1, wherein the mirror is on an upper surface of the movable stage.

4. The process tool according to claim 1, wherein the mirror is on a side surface of the movable stage.

5. The process tool according to claim 1, wherein the mirror is elongate in the X-Y plane.

6. The process tool according to claim 1, wherein the predetermined angle of inclination is substantially 45°.

7. The process tool according to claim 1, wherein the imaging sensor system has a controllable focus and/or a controllable zoom and further comprising a control circuit configured to control the focus and/or zoom of the imaging sensor system in synchronism with movements of the movable stage.

8. The process tool according to claim 1, wherein the imaging sensor system is mounted to the fixed part by an actuated stage configured to translate the imaging sensor system parallel to the X and/or Y directions and/or rotate the imaging sensor system about at least one axis.

9. The process tool according to claim 1, further comprising an illumination device configured to illuminate the component via the mirror when the movable stage is in the predetermined position.

10. The process tool according to claim 1, wherein the movable stage is configured to support a substrate and further comprising a projection system for projecting an image onto a substrate supported by the movable stage.

11. The process tool according to claim 10, wherein the process tool comprises the component and the component is a fluid handling system configured to confine liquid to a space between the projection system and the substrate.

12. A method of inspecting a component of a process tool for processing production substrates, the method comprising:
   positioning a movable stage having a mirror mounted thereon at a predetermined position relative to the component of the process tool; and
   using an imaging sensor system mounted on a fixed part of the process tool to capture an image of at least part of the component via the mirror, the component being other than a substrate, or a part thereof, handled by the process tool.

13. The method according to claim 12, wherein the process tool is a lithographic apparatus.

14. The method according to claim 13, wherein the component is a fluid handling system.

15. The method according to claim 12, wherein the positioning comprises movements in an X-Y plane and the imaging sensor system has an optical axis substantially parallel to the X-Y plane.

16. The method according to claim 12, wherein the positioning comprises movements in an X-Y plane and the mirror is oriented at a predetermined angle of inclination to the X-Y plane.

17. The method according to claim 12, wherein the movable stage is configured to support a production substrate and the mirror is on an upper surface of an inspection substrate held on the movable stage.

18. The method according to claim 12, wherein the imaging sensor system has a controllable focus and/or a controllable zoom and further comprising controlling the focus and/or zoom of the imaging sensor system in synchronism with movements of the movable stage.

19. The method according to claim 12, wherein the imaging sensor system is mounted to the fixed part by an actuated stage configured to translate the imaging sensor system and/or rotate the imaging sensor system about at least one axis.

20. The method according to claim 12, wherein the movable stage supports a substrate and further comprising projecting an image onto the substrate supported by the movable stage.

* * * * *